: US 12,392,850 B2
(45) Date of Patent: Aug. 19, 2025

(12) United States Patent
Astra et al.

(54) CRYOSTAT STRUCTURE FOR MAGNETIC RESONANCE IMAGING APPARATUS, AND MAGNETIC RESONANCE IMAGING APPARATUS

(71) Applicant: Siemens Healthcare Limited, Camberley (GB)

(72) Inventors: Eugene Astra, Eynsham (GB); Jun Zhao Wu, Shenzen (CN)

(73) Assignee: Siemens Healthcare Limited, Camberley (GB)

( * ) Notice: Subject to any disclaimer, the term of this patent is extended or adjusted under 35 U.S.C. 154(b) by 400 days.

(21) Appl. No.: 17/777,824

(22) PCT Filed: Nov. 19, 2020

(86) PCT No.: PCT/IB2020/060916
§ 371 (c)(1),
(2) Date: Jan. 20, 2023

(87) PCT Pub. No.: WO2021/099987
PCT Pub. Date: May 27, 2021

(65) Prior Publication Data
US 2023/0141678 A1 May 11, 2023

(30) Foreign Application Priority Data
Nov. 20, 2019 (CN) .......................... 201911140096.0

(51) Int. Cl.
*G01R 33/38* (2006.01)
*G01R 33/3815* (2006.01)
(52) U.S. Cl.
CPC ..... *G01R 33/3804* (2013.01); *G01R 33/3815* (2013.01)

(58) Field of Classification Search
CPC ............ G01R 33/3804; G01R 33/3815; G01R 33/3856; G01R 33/3403
See application file for complete search history.

(56) References Cited

U.S. PATENT DOCUMENTS 5,375,423 A 12/1994 Delatte
5,381,666 A 1/1995 Saho et al.
(Continued)

FOREIGN PATENT DOCUMENTS

CN 1057329 A 12/1991
CN 101221000 A 7/2008
(Continued)

OTHER PUBLICATIONS

Mar. 5, 2021 (PCT) International Search Report—App PCT/IB2020/060916.

*Primary Examiner* — Rodney A Bonnette
(74) *Attorney, Agent, or Firm* — Banner & Witcoff Ltd.

(57) ABSTRACT

The present disclosure provides a cryostat structure for a magnetic resonance imaging device and a magnetic resonance imaging apparatus comprising the same. The cryostat structure including: a casing which forms a ring-shaped chamber inside; a refrigerant container disposed in the chamber and housing a superconducting coil, so that the superconducting coil is immersed in the liquid refrigerant; a heat shield layer disposed between the casing and the refrigerant container for shielding heat radiation from the casing; the casing has a suction hole which is detachably sealed by a sealing cover, and an adsorption chamber is provided on one side of the casing facing the ring-shaped chamber, and an adsorbent capable of adsorbing overflowing elements from the casing or the refrigerant container or the heat shielding layer is contained in the adsorption chamber.

6 Claims, 2 Drawing Sheets

(56) References Cited

U.S. PATENT DOCUMENTS

| | | | |
|---|---|---|---|
| 2008/0168777 A1 | 7/2008 | Atkins et al. | |
| 2009/0158752 A1* | 6/2009 | Clayton | F25B 9/14 |
| | | | 324/318 |
| 2009/0212891 A1* | 8/2009 | Hickman | H01F 6/006 |
| | | | 335/216 |
| 2010/0051307 A1* | 3/2010 | Tigwell | G01R 33/3815 |
| | | | 174/15.5 |
| 2010/0225321 A1* | 9/2010 | Kruip | G01R 33/3854 |
| | | | 324/318 |
| 2012/0075045 A1* | 3/2012 | Calvert | H01F 6/04 |
| | | | 335/216 |
| 2019/0301677 A1 | 10/2019 | Wei et al. | |
| 2019/0302204 A1* | 10/2019 | Koeber | G01R 33/3804 |

FOREIGN PATENT DOCUMENTS

| | | |
|---|---|---|
| CN | 203500826 U | 3/2014 |
| CN | 107423221 A | 12/2017 |

\* cited by examiner

CRYOSTAT STRUCTURE FOR MAGNETIC RESONANCE IMAGING APPARATUS, AND MAGNETIC RESONANCE IMAGING APPARATUS

CROSS-REFERENCE TO RELATED APPLICATIONS

The present application is a U.S. National Stage Entry of PCT application no. PCT/IB2020/060916, filed on Nov. 19, 2020, which claims the benefit of the filing date of China patent application no. CN 201911140096.0, filed on Nov. 20, 2019, the contents of which are incorporated herein by reference in their entireties.

TECHNICAL FIELD

The present disclosure relates to a cryostat structure for a magnetic resonance imaging apparatus and, more particularly, to a cryostat structure suitable for long-distance transportation and a magnetic resonance imaging apparatus equipped with the cryostat structure.

BACKGROUND

In an existing magnetic resonance imaging apparatus, a superconducting coil used to generate a main magnetic field for imaging is immersed in low-temperature liquid helium with a small latent heat of vaporization, and the liquid helium is kept at 4.2K by means of a refrigerator, thereby enabling the superconducting coil to remain in a superconducting state. In the cryostat structure of the existing magnetic resonance imaging apparatus, the liquid helium is stored in a liquid helium tank, and a radiation-proof heat shield layer is provided outside the liquid helium tank; the liquid helium tank and the shielding layer are suspended in an outer-layer vacuum chamber by means of a suspension device. The heat shield layer and the liquid helium tank need to be connected to a first stage (temperature of 50K) and a second stage (temperature of 4.2K) of the refrigerator, respectively.

However, in the process of transporting the magnetic resonance apparatus from the factory to the end-of-use (user) site, especially in the process of long-distance transport (e.g. by ship for tens of days), sometimes it is necessary to use air transport, but this method has a very high cost; or the liquid helium tank is filled with liquid helium, but the liquid helium will change to a gaseous state and be completely lost as the temperature rises during transportation, and liquid helium, as an expensive material, will also result in an excessive cost; alternatively, cold chain transportation can also be used, but this method also faces the problem of high cost.

SUMMARY

In view of the above, the present disclosure proposes a cryostat structure for a magnetic resonance imaging apparatus that enables long-distance transportation with a simple structure, and a magnetic resonance imaging apparatus equipped with the cryostat structure.

An embodiment of the present disclosure provides a cryostat structure for a magnetic resonance imaging apparatus, comprising: a casing, having an annular chamber formed in the interior thereof; a refrigerant container arranged in the chamber, with a superconducting coil being accommodated in the refrigerant container in such a way that the superconducting coil is immersed in a liquid refrigerant; a heat shield layer, arranged between the casing and the refrigerant container, and configured to block thermal radiation from the casing; the casing having a suction hole, the suction hole being blocked by a sealing cover in a detachable manner, the sealing cover having an adsorption chamber having an opening facing the chamber side, and the adsorption chamber containing an adsorbent capable of adsorbing an overflowing element from the casing or the refrigerant container or the heat shield layer.

In the cryostat structure described above, the opening of the adsorption chamber may be covered by a mesh sheet with mesh.

In the cryostat structure described above, the mesh sheet may be fixed so as to cover the opening of the adsorption chamber by an annular pressure plate.

In the cryostat structure described above, the overflowing element may be hydrogen and the adsorbent may be a silver zeolite.

Another embodiment of the present disclosure provides a magnetic resonance imaging apparatus, comprising the cryostat structure described above.

According to the structure of the cryostat of the present disclosure, since the adsorbent provided in the sealing cover is used to adsorb free elements that separate out from the casing or the refrigerant container or the heat shield layer, it is possible to ensure that the cryostat can still keep the vacuum degree of the chamber in a satisfactory state, and to reduce the transfer of heat from the casing to the refrigerant container, when the refrigerator is not working for a long period of time (e.g. several tens of days). Therefore, even after long-distance transportation, such as 60 days of sea transportation, the superconducting coil can be kept at a temperature not exceeding a specified temperature, such as 40 degrees. In addition, using the cryostat structure of the present disclosure, since the vacuum degree of the chamber is maintained effectively and the transfer of heat from the casing to the refrigerant container is reduced, it is not necessary to inject expensive liquid helium into the refrigerant container when long-distance transportation takes place, thus liquid helium loss is reduced and costs are further lowered.

BRIEF DESCRIPTION OF THE DRAWINGS

Preferred embodiments of the present disclosure are described in detail below with reference to the accompanying drawings, to give those skilled in the art a clearer understanding of the abovementioned and other features and advantages of the present disclosure. Drawings.

KEY TO THE DRAWINGS 1. cryostat;
10. casing;
12. chamber;
14. suction hole;
16. sealing cover;
161. adsorption chamber;
162. silver zeolite;
163. pressure plate;
164. screw;

20. refrigerant container;
22. liquid refrigerant;
24. superconducting coil;
30. heat shield layer.

DETAILED DESCRIPTION OF THE DISCLOSURE

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than that shown or described here. In addition, the terms "comprise" and "have" and any variants thereof are intended to cover non-exclusive inclusion. For example, a process, method, system, product or apparatus comprising a series of steps or modules or units is not necessarily limited to those steps or modules or units which are clearly listed, but may comprise other steps or modules or units which are not clearly listed or are intrinsic to such processes, methods, products or apparatuses.

Figure 1:
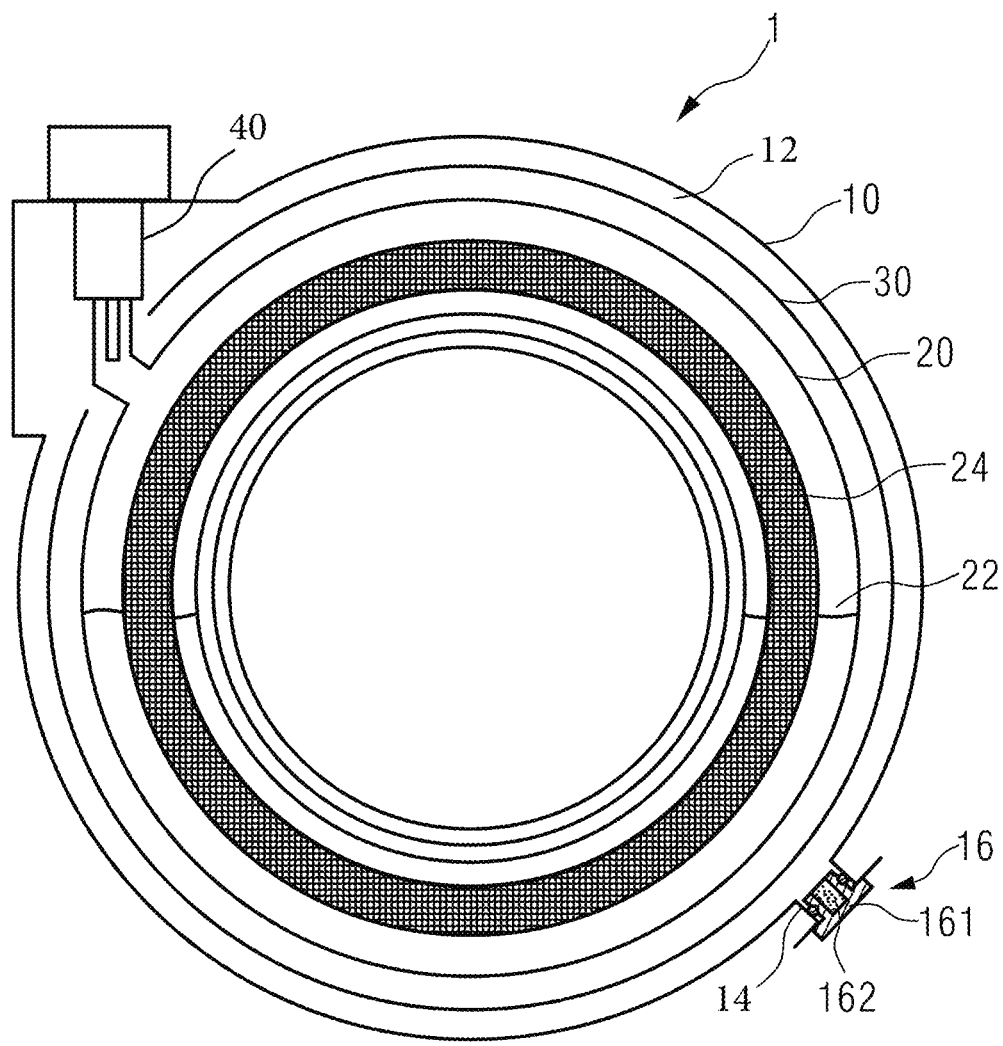
FIG. 1 is an explanatory diagram of the cryostat structure for a magnetic resonance imaging apparatus according to the present disclosure.

FIG. 1 shows an explanatory diagram of the structure of a cryostat 1 for a magnetic resonance imaging apparatus according to the present disclosure. As shown in FIG. 1, the cryostat 1 of the present disclosure comprises: a casing 10, a refrigerant container 20, and a heat shield layer 30. In this embodiment, the casing 10 is made of a stainless steel material, an annular chamber 12 is formed inside, and the refrigerant container 20 is arranged in the chamber 12. The refrigerant container 20 is also made of a stainless steel material; a liquid refrigerant 22, such as liquid helium, is contained in the refrigerant container 20. In addition, a superconducting coil 24 for generating a main magnetic field for magnetic resonance imaging is immersed in the liquid refrigerant 22. The heat shield layer 30 is made of aluminum and arranged between the casing 10 and the refrigerant container 20, and is connected to a first-stage cold head of a refrigerator in a turret 40; the refrigerant container 20 is connected to a second-stage cold head of the refrigerator. When the magnetic resonance imaging apparatus is energized, the temperature of the heat shield layer is cooled to 50K to block thermal radiation from the casing 10, and the temperature of the refrigerant container 20 is cooled to 4.2K to keep the superconducting coil 24 in a superconducting state.

In addition, as shown in FIG. 1, the casing 10 has a suction hole 14 for evacuating the chamber 12, and the suction hole 14 is blocked by a sealing cover 16 in a detachable manner. During the manufacture of the magnetic resonance imaging apparatus, it is necessary to use the suction hole 14 to evacuate the chamber 12 to a vacuum state, so as to reduce the transfer of heat from the casing 10 to the refrigerant container 20. However, after the chamber 12 has been evacuated, when the refrigerator is working, the chamber 12 can maintain a relatively good vacuum state, but when the refrigerator stops working, the vacuum state of the chamber 12 will gradually be destroyed. Consequently, external heat from the casing 10 is rapidly transferred to the refrigerant container 20, with the result that the temperature of the superconducting coil 24 in the refrigerant container 20 rises. The inventors of the present disclosure have discovered through research that this is because, when the refrigerator is working, hydrogen that separates out of the stainless steel used to make the casing 10 or the refrigerant container 20 gathers in a static state on the surface of the low-temperature refrigerant container 20; at this time, the chamber 12 can maintain a good degree of vacuum. However, when the refrigerator is not working, for example, when the temperature of the refrigerant container 20 reaches 20K, the hydrogen that separates out will change to a free state, and this will cause the vacuum state of the chamber 12 to be destroyed, and the transfer of heat from the casing 10 or the heat shield layer 30 to the refrigerant container 20 is restored. Therefore, when transporting over a long distance, the vacuum state of the chamber 12 will be gradually destroyed due to the refrigerator not working for a long time, and heat outside the apparatus will be transferred to the refrigerant container 20 via the casing 10 and the heat shielding layer 30; at this time, the temperature of the superconducting coil 24 will reach several tens of degrees Celsius, and in this situation, the superconducting coil 24 might malfunction as a result. In view of this, the inventors of the present disclosure have provided an adsorption chamber 161 at the side of the sealing cover 16 that faces the chamber 12, and stored in the adsorption chamber 161 an adsorbent that can effectively adsorb hydrogen, such as a silver zeolite 162. Thus, during long-distance transportation, the adsorbent can effectively adsorb free hydrogen, to maintain the degree of vacuum of the chamber 12, and reduce the transfer of heat from the casing 10 to the refrigerant container 20.

Figure 2:
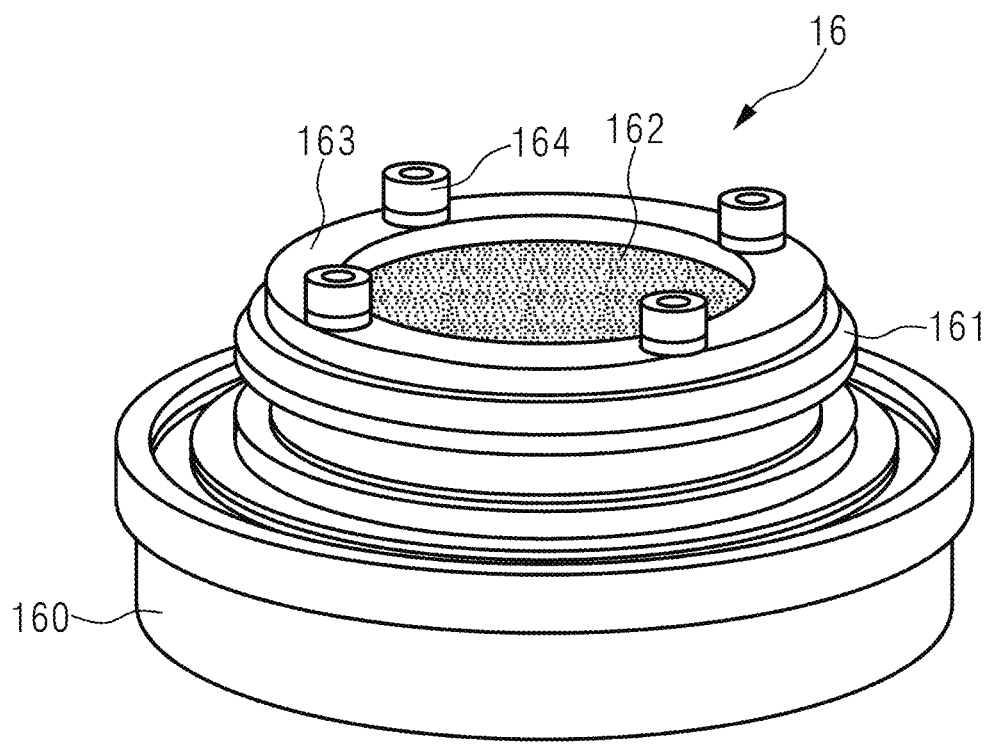
FIG. 2 is a schematic explanatory view of the sealing cover according to the present disclosure.

FIG. 2 shows a schematic explanatory view of the sealing cover 16 according to the present disclosure. As shown in FIG. 2, the sealing cover 16 of the present disclosure comprises a cap body 160, and the adsorption chamber 161 having an opening facing the chamber side. The adsorption chamber 161 contains the silver zeolite 162, which has a very good adsorption effect on elemental hydrogen, as the adsorbent. The opening of the adsorption chamber 161 is covered by a mesh sheet 162 with mesh. Furthermore, the mesh sheet 162 is fixed so as to cover the opening of the adsorption chamber 161 by an annular pressure plate 163 using screws 164.

In the present disclosure, the case where the casing 10 and the refrigerant container 20 are made of stainless steel, and the stainless steel releases hydrogen, is shown as an example; in this case, the silver zeolite is used as the adsorbent. However, when the casing 10 or the refrigerant container 20 or the heat shield layer 30 is made of another material and releases another element, an adsorbent with a good adsorption effect corresponding to the other element can also be selected accordingly.

According to the structure of the cryostat 1 of the present disclosure, since the adsorbent provided in the sealing cover is used to adsorb free elements that separate out from the casing or the refrigerant container or the heat shield layer, it is possible to ensure that the cryostat 1 can still keep the vacuum degree of the chamber in a satisfactory state, and reduce the transfer of heat from the casing to the refrigerant container, when the refrigerator is not working for a long period of time (e.g. several tens of days). Therefore, even after long-distance transportation, such as 60 days of sea transportation, the superconducting coil can be kept at a temperature not exceeding a specified temperature, such as 40 degrees. In addition, using the cryostat structure of the present disclosure, since the vacuum degree of the chamber is maintained effectively and the transfer of heat from the casing to the refrigerant container is reduced, it is not necessary to inject expensive liquid helium into the refrigerant container when long-distance transportation takes place, thus liquid helium loss is reduced and costs are further lowered.

In the above embodiment, the case where the casing and the refrigerant container are made of a stainless steel material and release elemental hydrogen is shown as an example. However, when the casing or the refrigerant container or the heat shield layer is made of another material and releases another element different from elemental hydrogen, a corresponding adsorbent capable of effectively adsorbing the other element may also be provided in the adsorption chamber.

The embodiments above are merely preferred embodiments of the present disclosure, which are not intended to limit it. Any amendments, equivalent substitutions or improvements etc. made within the spirit and principles of the present disclosure shall be included in the scope of protection thereof.

The invention claimed is:

1. A cryostat structure for a magnetic resonance imaging device, comprising:
   a casing, which forms a ring-shaped chamber inside, the casing having a suction hole which is detachably sealed by a sealing cover;
   a refrigerant container disposed in the ring-shaped chamber and housing a superconducting coil in the refrigerant container such that the superconducting coil is immersed in liquid refrigerant;
   a heat shield layer disposed between the casing and the refrigerant container, the heat shield layer being configured to shield the casing from heat radiation;
   an adsorption chamber (i) provided on one side of the casing facing the ring-shaped chamber, and (ii) disposed on one side of the sealing cover facing the ring-shaped chamber; and
   an adsorbent contained in the adsorption chamber, the adsorbent being configured to adsorb overflowing elements from the casing, the refrigerant container, or the heat shield layer.

2. The cryostat structure according to claim 1, wherein an opening of the adsorption chamber is covered by a mesh sheet.

3. The cryostat structure according to claim 2, wherein the mesh sheet is fixed and covered by the opening of the adsorption chamber by an annular pressure plate.

4. The cryostat structure according to claim 1, wherein the casing is made of stainless steel.

5. The cryostat structure according to claim 1, wherein the refrigerant container is made of stainless steel.

6. The cryostat structure according to claim 1, wherein the adsorbent is made of silver zeolite.

* * * * *